(12) United States Patent
Bottari et al.

(10) Patent No.: US 7,077,927 B2
(45) Date of Patent: Jul. 18, 2006

(54) METHOD OF APPLYING AN EDGE ELECTRODE PATTERN TO A TOUCH SCREEN

(75) Inventors: Frank J. Bottari, Acton, MA (US); Andrea C. Marble, Andover, MA (US)

(73) Assignee: 3M Innovative Properties Company, St. Paul, MN (US)

( * ) Notice: Subject to any disclaimer, the term of this patent is extended or adjusted under 35 U.S.C. 154(b) by 68 days.

(21) Appl. No.: 10/748,548

(22) Filed: Dec. 30, 2003

(65) Prior Publication Data

US 2004/0149377 A1    Aug. 5, 2004

Related U.S. Application Data

(60) Continuation of application No. 10/050,512, filed on Jan. 16, 2002, now abandoned, and a continuation-in-part of application No. 09/886,452, filed on Jun. 21, 2001, now abandoned, which is a division of application No. 09/365,100, filed on Jul. 30, 1999, now Pat. No. 6,280,552.

(51) Int. Cl.
*B29C 65/02* (2006.01)
*B32B 37/02* (2006.01)
*B32B 37/14* (2006.01)
*B32B 37/20* (2006.01)
*B32B 38/14* (2006.01)

(52) U.S. Cl. ............ 156/233; 156/238; 156/241; 156/247; 156/277; 156/289; 427/147; 427/148; 427/124; 427/125

(58) Field of Classification Search ............ 156/230, 156/233, 240, 241, 247, 277, 289, 238; 427/146–148, 427/123–125, 96; 428/40.1, 40.2, 41.7, 41.8, 428/42.2, 42.3, 105, 200, 202, 203, 205, 428/206, 208, 343, 344, 914; 345/173
See application file for complete search history.

(56) References Cited

U.S. PATENT DOCUMENTS 2,711,983 A    6/1955    Hoyt (Continued)

OTHER PUBLICATIONS

U.S. Appl. No. 09/773,979, filed Feb. 1, 2001, Touch Screen Panel with Integral Wiring Traces.

*Primary Examiner*—Chris Fiorilla
*Assistant Examiner*—Sing P. Chan
(74) *Attorney, Agent, or Firm*—Robert J. Pechman (57) ABSTRACT

A method of applying an edge electrode pattern to a touch screen. The method includes depositing, on a first surface of a decal strip, conductive material in the form of an edge electrode pattern, placing the first surface of the decal strip on one edge of a touch screen, applying heat and pressure to an opposite surface of the decal strip until the edge electrode pattern is transferred from the first surface of the decal strip to the touch screen; and removing the decal strip.

5 Claims, 8 Drawing Sheets

U.S. PATENT DOCUMENTS

| | | | |
|---|---|---|---|
| 3,703,603 A * | 11/1972 | Levesoue et al. | 174/268 |
| 3,729,819 A | 5/1973 | Horie | |
| 4,198,539 A | 4/1980 | Pepper, Jr. | |
| 4,293,734 A | 10/1981 | Pepper, Jr. | |
| 4,369,063 A | 1/1983 | McGowan, Jr. | |
| 4,371,746 A | 2/1983 | Pepper, Jr. | |
| 4,694,573 A | 9/1987 | Nishino et al. | |
| 4,697,885 A | 10/1987 | Minowa et al. | |
| 4,846,869 A | 7/1989 | Palanisamy | |
| 5,346,651 A | 9/1994 | Oprosky et al. | |
| 5,600,359 A * | 2/1997 | Kikuchi | 347/171 |
| 5,620,904 A | 4/1997 | Hanoka | |
| 6,280,552 B1 | 8/2001 | Bottari | |
| 6,549,193 B1 | 4/2003 | Huang et al. | |

* cited by examiner

METHOD OF APPLYING AN EDGE ELECTRODE PATTERN TO A TOUCH SCREEN

CROSS REFERENCE TO RELATED APPLICATIONS

This application is a continuation of U.S. application Ser. No. 10/050,512, filed Jan. 16, 2002, now abandoned, and is a continuation-in-part of U.S. application Ser. No. 09/886, 452, filed Jun. 21, 2001, now abandoned, which was a divisional of U.S. application Ser. No. 09/365,100, filed Jul. 30, 1999, issued as U.S. Pat. No. 6,280,552.

FIELD OF THE INVENTION

This invention relates to a method of applying an edge electrode pattern and also wire traces to a touch screen.

BACKGROUND OF THE INVENTION

Touch screen panels generally comprise an insulative (e.g., glass) substrate and a resistive layer disposed on the insulative substrate. A pattern of conductive edge electrodes are then formed on the edges of the resistive layer. The conductive electrodes form orthogonal electric fields in the X and Y directions across the resistive layer. Contact of a finger or stylist on the panel then causes the generation of a signal that is representative of the X and Y coordinates of the location of the finger or stylist with respect to the substrate. In this way, the associated touch panel circuitry connected to the panel by a wiring harness can ascertain where a touch occurred on the substrate.

Typically, a computer program generates an option to the user (e.g., "press here for 'yes' and press here for 'no'") on a monitor underneath a touch screen panel and the conductive electrode pattern assists in detecting which option was chosen when the touch screen panel was touched by the user.

There are typically four insulated individual wires, each extending along and around the edges of the touch screen panel to each corner of the touch screen panel where the insulation is removed and the wire is hand soldered to a terminal electrode on the panel at each corner of the panel. One or more additional layers, usually tape, are often used to secure the wires to the edges of the panel and there may be an insulative layer between the wires and the edge electrodes of the panel to electrically isolate the wires from the edge electrodes.

The problem with such prior art devices are numerous. The soldered joints are often not very reliable and create solder bumps on the smooth surface. Moreover, the act of soldering the ends of each wire to the corner electrodes can damage the electrodes or even crack the glass substrate of the touch panel. Also, this assembly process is labor intensive and costly. Tape may be placed under and/or over the wires. Thus, the assembled touch screen panel does not have a finished appearance. Instead, the taped on wires are readably noticeable and detract from the appearance of the touch screen panel.

For many years, the applicant and others screen printed the edge electrode pattern and the wire traces right on the resistive layer of the touch screen panel.

Normally, the edge electrode pattern is printed directly on the resistive layer of the touch screen panel. Screen printing techniques are used to deposit silver/frit ink directly onto the glass sensor coated with a thin layer of tin oxide. After the pattern is printed, the wet ink is normally dried by heating the panel to about 100° C. for about 5 minutes to reduce the chance that the ink could be removed during subsequent handling. The ink is then fired at about 500° C. for about 20 minutes to sinter and fuse the silver/glass frit mixture to the tin oxide coated glass substrate. This process produces an edge electrode pattern that is mechanically bonded to the touch screen panel and which makes good electrical contact with the tin oxide layer.

The screen printing process, however, can lead to a number of problems when attempts are made to achieve a quality edge electrode pattern. The most severe problem occurs when printing on non-flat or curved glass substrates. In screen printing, a critical parameter in determining the characteristics of the printed pattern is the distance between the printing screen and the substrate. When printing on curved substrates using conventional screen printing equipment, this distance varies with the degree of curvature of the substrate resulting in non-uniform thickness of the printed ink. The whole touch screen cannot be printed at once especially when the area is large or the touch screen has a small radius of curvature. Instead two or more passes and adjustment of the touch screen between passes is required. This problem, in turn, can lead to mismatches in the electrode pattern. Furthermore, standard automated screen-printing equipment, which requires a uniform and repeatable force to push the ink through the printing screen, can not be used with curved screens due to the mismatch of the flat printing screen and the non-flat substrate. In this case, the curved screens can only be printed by manually forcing the ink through the printing screen with a squeegee. The non-reproducible force used in this manual process leads to further variations in the thickness of the printed ink. Frequently, this process also leads to fatal defects in the edge electrode pattern such as complete breaks in the conductive lines of the electrode pattern which subsequently require additional time and labor to rework or reprocess the touch screen panel.

In various fields of technology which are not analogous to the production of touch screens, it is known to apply patterns to a glass surface using a decal transfer method. See, for example, U.S. Pat. Nos. 4,369,063; 4,846,869; 5,346,651; and 2,711,983. These prior art decal transfer methods are typically used only in conjunction with flat substrates. For example, U.S. Pat. No. 4,846,869 describes a method of applying sensors to a windshield by first applying the sensor pattern to the windshield when it is flat and then heating the windshield to shape it into its final curved form. This method can not be used to apply electrode patterns to glass substrates in the manufacture of touch screens because the glass must be curved or bent before the edge electrode pattern can be applied. The reason is that the resistive coating must be applied before the electrode pattern is applied and such a coating cannot withstand the high temperatures which are required to bend glass. U.S. Pat. No. 2,711,983 discloses a method of applying printed electric circuits to curved support surfaces by the use of a decal. In this case, however, the support surface is not a part of the electrical circuit. And it would be undesirable for the decal to make electrical contact with the support surface. In contrast, in the manufacture of touch screens, the support surface, namely the glass substrate, is an integral part of the circuit and it is essential that the electrodes make intimate electrical contact with the resistive tin oxide surface.

After the edge electrode pattern is applied by printing techniques to the touch screen panel, and a protective coating is applied, the next step is to connect individual wires to the corner electrodes at the four corners of the touch screen panel. Typically, the ends of each wire are soldered to the corner electrodes and the individual wires taped to the sides of the panel. In some cases, a noise shield layer, usually in the form of some kind of a tape, is placed in a border configuration around the perimeter of the touch screen panel between the edge electrodes and the individual wires which form a part of the control electronics. In still other cases, a layer of tape is placed on top of the wires again in a border configuration around the perimeter of the touch screen panel.

The result is a touch screen panel with a less than finished appearance since the bulky wires are readily noticeable. Also, the act of soldering the ends of the wires to the corner electrodes can damage the corner electrodes or even damage the substrate. Worse, the solder joints have a tendency to fail.

The applicant then developed a waterslide decal. See U.S. Pat. No. 6,280,552, incorporated herein by this reference. The edge electrode pattern and the wire traces were screen printed on the decal paper which was then coated with a cover coat. The paper was activated with water and removed and the cover coat kept the edge electrode pattern and the wire traces intact as they were transferred to the touch screen. This method resulted in an improvement over prior art screen printing techniques.

The problems associated with this method, however, include the fact that the cover coat must be burned off the panel resulting in an additional manufacturing step and the possibility of damaging the edge electrodes and/or the wire traces. Moreover, the decal tended to float on the glass touchscreen making automation of the transfer procedure difficult. Even by using utmost care, the edge electrode pattern can be distorted when the waterslide decal is used. Also, impurities in the water which contact the touchscreen panel can contaminate the panel. In short, the waterslide decal sometimes resulted in an unpredictable, low reliability, and inaccurate procedure. The above referenced patent also discloses and claims a heat transfer decal. Herein, a new heat transfer decal is disclosed.

SUMMARY OF THE INVENTION

It is therefore an object of this invention to provide a new method of applying an edge electrode pattern to a touch screen.

It is a further object of this invention to provide such a method which eliminates the problems associated with waterslide decal transfer methods.

It is a further object of this invention to provide such a method which results in predictable, high reliability, and accurate procedures for the manufacturing of touch screen panels.

The invention results from the realization that the problems associated with the use of waterslide decals to apply an edge electrode pattern to a touch screen including the need to later burn off the cover coat can be eliminated by using a heat transfer decal without a cover coat and preferably in the form of strips to apply the edge electrode pattern whereupon the edge electrode pattern is released from the decal paper under the application of heat and pressure and transferred to the touch screen—a process which lends itself more easily to an automated and repeatable procedure.

This invention results from the further realization that the wire traces can now be also applied to the touch screen panel at the same time as the edge electrodes and even electrically isolated in advance from the edge electrodes by depositing an isolation layer such as a dielectric layer over the wire traces so that when the edge electrodes and wire traces are transferred to the touch screen panel, the wire traces are not in contact with the resistive layer.

This invention results from the further realization that a protective layer can be laid down on the decal paper beneath the edge electrodes and the wire traces so that when the edge electrodes and the wire traces are transferred to the touch screen panel, the protective layer is the top most layer and protects the edge electrodes and the wire traces.

This invention features a method of applying an edge electrode pattern to a touch screen and a touch screen made by the method comprising depositing, on a first surface of a decal strip, conductive material in the form of an edge electrode pattern, placing the first surface of the decal strip on one edge of a touch screen, applying heat and pressure to an opposite surface of the decal strip until the edge electrode pattern is transferred from the first surface of the decal strip to the touch screen, and removing the decal strip.

The method may further include the step of depositing a wire trace pattern on the first surface of the decal strip and also the step of isolating the wire trace pattern from the edge electrode pattern after the wire trace pattern and the edge electrode pattern are transferred to the touch screen by using a laser to remove material between the wire trace pattern and the edge electrode pattern.

In another example, a wire trace pattern is deposited on the decal strip and an isolation layer is deposited between the wire trace pattern and the edge electrode pattern. The isolation layer may be disposed between the wire trace pattern and the edge electrode pattern and the edge electrode pattern is then typically deposited adjacent the wire trace pattern on the decal strip. Further included may be the step of depositing a protective layer between the decal strip and the edge electrode pattern and the wire trace pattern. Alternatively, the isolation layer is disposed over the wire trace pattern and the edge electrode pattern is deposited on the isolation layer. In this example, a protective layer may be deposited between the decal strip and the wire trace pattern.

Preferably, heat and pressure is applied by a hot stamp machine equipped with a heated pad disposed between a feed roll of decal paper and take up roll and over a holder for the touch screen. Screen printing is the preferred method of placing the conductive material onto the decal strip. The temperature used to apply heat is typically between 300 and 400° F. and the pressure applied is between 15 Psi and 30 Psi. The protective layer and the isolation layer are typically a lead borosilicate glass composition.

This invention also features a decal for transferring an edge electrode pattern to a touch screen, the decal comprising a decal strip and on one surface of the decal strip, a conductive material printed in the form of an edge electrode pattern. Preferably, there is also a wire trace pattern on the decal strip. In one embodiment, an isolation layer is located between the wire trace pattern and the edge electrode pattern. There may also be a protective layer between the decal strip and the edge electrode and the wire trace pattern. In another embodiment, the isolation layer is disposed over the wire trace pattern, the edge electrode pattern is deposited on the isolation layer, and a protective layer is located between the decal strip and the wire trace pattern.

Although decal strips are preferred, this invention also features a method of applying an edge electrode pattern to a touch screen, the method comprising depositing, on a first surface of decal paper, conductive material in the form of an edge electrode pattern, a wire trace pattern, and an isolation layer between the edge electrode pattern and the wire trace pattern, placing the first surface of the decal on a touch screen, applying heat and pressure to an opposite surface of the decal paper until the edge electrode pattern, the wire trace pattern, and the isolation layer are transferred to the touch screen, and removing the decal paper.

A decal for transferring an edge electrode pattern and a wire trace pattern to a touch screen in accordance with this invention features decal paper and on one surface of the decal paper, a conductive material printed in the form of an edge electrode pattern and one or more wire traces proximate the edge electrode pattern and electrically isolated therefrom. Further included may be a protective layer between a) the edge electrodes and wire traces and b) the decal paper, and an isolation layer over each wire trace. Alternatively, a protective layer is located between the wire traces and the decal paper, an isolation layer is placed over each wire trace, and the edge electrode pattern is located on the isolation layer.

One method of applying an edge electrode pattern and a wire trace pattern to a touch screen includes the following steps: depositing, on a heat transfer decal paper, conductive material in the form of an edge electrode pattern and a wire trace pattern, placing the decal on a touch screen, applying heat and pressure to the decal paper until the edge electrode pattern and the wire trace pattern are transferred to the touch screen and removing the decal paper.

And, a decal for transferring an edge electrode pattern to a touch screen, in accordance with this invention, features the use of heat transfer decal paper and, on the decal paper, a conductive material printed in the form of an edge electrode pattern and one or more wire traces proximate the edge electrode pattern.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
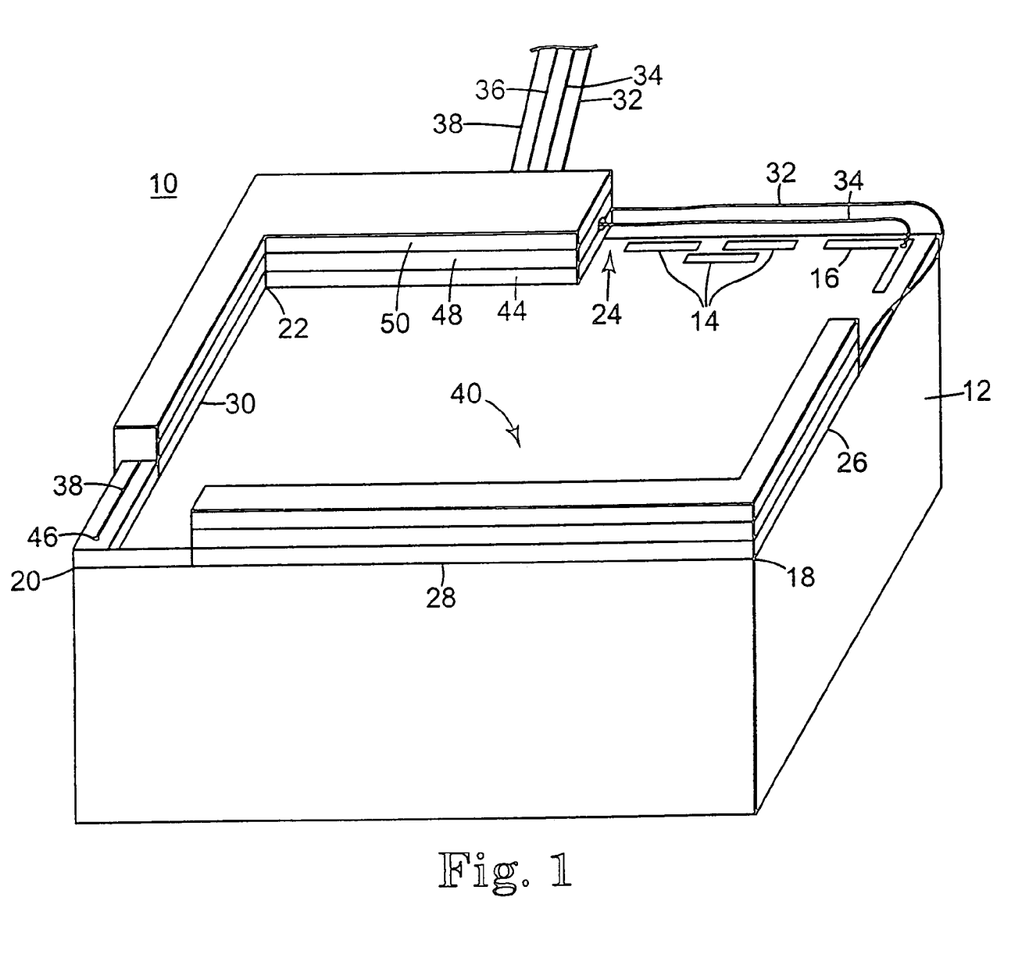
FIG. 1 is a schematic view of a prior art touch screen.

Prior art touch screen panel 10, FIG. 1, includes substrate 12 which usually includes or is an insulative layer (e.g., glass), a resistive layer over the primary working surface of the insulative layer, and a pattern of edge electrodes 14 and terminal electrodes, usually corner electrodes such as electrode 16, on the resistive layer as is known in the art. There are additional corner electrodes (not shown) one at each other corner 18, 20, and 22 of the touch screen. The edge electrodes 14 repeat in some predetermined patterned fashioned along each edge 24, 26, 28, and 30 of panel 10. In the prior art, wires 32, 34, 36, and 38 extend to each corner electrode and with their ends stripped of insulation are soldered to the respective corner electrodes in order to generate the appropriate electrical field across the working or active surface 40 of panel 10. So, for example, wire 32 extends along edges 24 and 26 of panel 10 to the corner electrode (not shown) at corner 18; wire 34 extends along edge 24 of panel 10 to corner electrode 16; wire 38 extends along edges 24 and 30 of panel 10 to a corner electrode (not shown) at corner 20; and wire 36 extends along edge 24 of panel 10 to a corner electrode (not shown) at corner 22. In some prior art embodiments, electrical tape and then an insulated copper shield layer 44 was laid between the wires and the edge electrodes to electrically isolate edge electrodes 14. A hole was then formed in the insulative tape proximate each corner electrode as shown at 46 in order to solder the ends of each wire to the appropriate corner electrode. Alternatively, layer 44 ends just before each corner electrode. In other embodiments, the wires were simply taped to the edges of panel 10. In still other embodiments, tape layer 48 and/or a protective (e.g., "Kapton") tape layer 50 are placed over the wires. Insulated noise shield tape layer 44 may be placed over the edge electrodes and under wires 32, 34, 36, and 38.

In FIG. 1, the thickness and width of border layers 44, 48, and 50 are greatly exaggerated for the purposes of illustration as is the thickness of substrate 12. Actual touch screen panels are usually ⅛ inch thick or less and layers 44, 48, and 50 are substantially thinner than that but still wires 32, 34, 36, and 38 make the completed assembly appear somewhat bulky and unfinished.

Moreover, prior art touch screen panel 10 possesses reliability problems in some cases because the solder joints between the individual wires and the corner electrodes can fail. Further, the act of soldering the ends of each wire to the corner electrodes can damage the electrodes or even crack the substrate of the touch screen panel. In addition, the assembly process wherein the wires are soldered at their ends to the corner electrodes and taped to the edges of the panel is labor intensive and hence costly.

In the subject invention, in contrast, the wiring is integrated as a part of the touch screen panel so that there are no bulky wires or layers of tape associated with the touch screen panel as is the case with the prior art.

Figure 2:
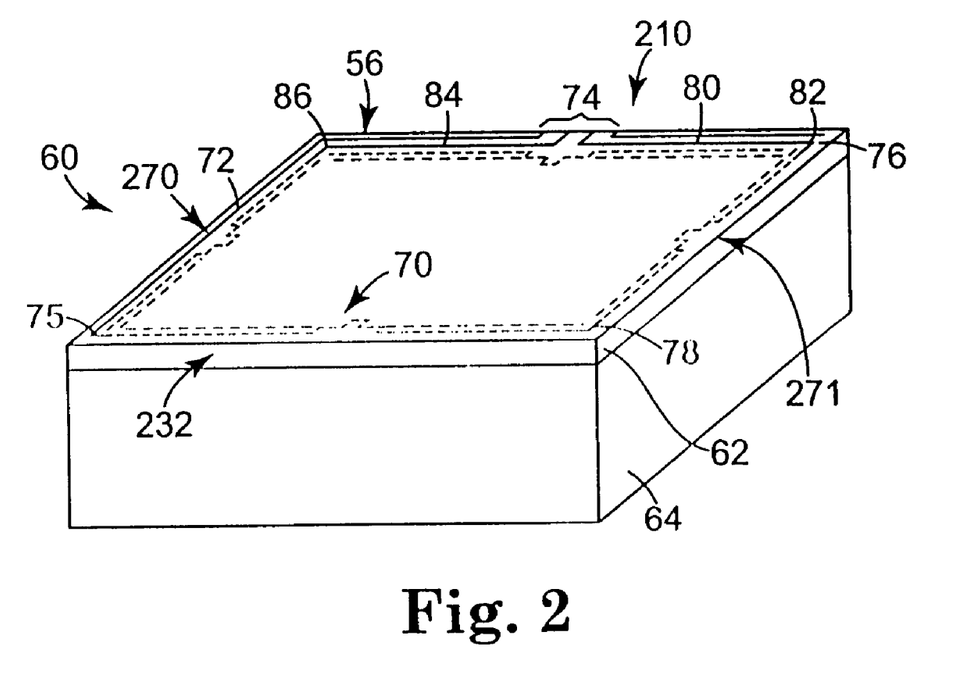
FIG. 2 is a schematic top view of a touch screen manufactured in accordance with the subject invention.

Touch screen panel 60, FIG. 2 in accordance with this invention is manufactured by applying resistive coating 62 (e.g., tin antimony oxide) by a vacuum sputter process to glass substrate 64 (e.g., soda lime glass). Coating 62 is less than 1000 angstroms thick and substrate 64 is typically between 1–3 mm thick and 15 inches on a diagonal.

A dielectric border layer may be deposited on the periphery of resistive coating 62 using a lead borosilicate glass composition ⅛ inch wide and 10 microns thick (after firing) along the edges of panel 60. The border layer provides electrical isolation between the individual wire traces of the wiring harness and electrical isolation between the wire traces and the edge electrodes of the edge electrode pattern. Conductive edge electrode pattern 70 is applied to resistive coating 62 using a conductive silver/frit paste available from DuPont (No. 7713) and at the same time the wire trace pattern is applied on the border layer also using the silver/fit paste.

As shown, wire trace 72 begins at junction or connection point 74 and extends along top edge 210 and side edge 270 of the panel to corner electrode 75 of electrode pattern 70. Wire trace 76 similarly begins at junction 74 and extends along top edge 210 and opposite side edge 271 of the panel to corner electrode 78 of the edge electrode pattern. Wire trace 80 begins at junction 74 and only extends along top edge 210 to corner electrode 82 and wire trace 84 begins at junction 74 and extends only along top edge 210 to corner electrodes 86 of electrode pattern 70.

The height of each wire trace is typically between 12–16 microns and each trace is between 0.015" and 0.025" wide. Edge electrode pattern 70 may take the form of the pattern disclosed of co-pending application Ser. No. 09/169,391, or the forms disclosed in U.S. Pat. Nos. 4,198,539; 4,293,734; or 4,371,746 hereby incorporated herein by this reference.

Typically the edge electrode pattern and the wire trace pattern occupy only about ⅜ inch on the edges of panel 60 and thus FIG. 2 is not to scale.

Figure 3:
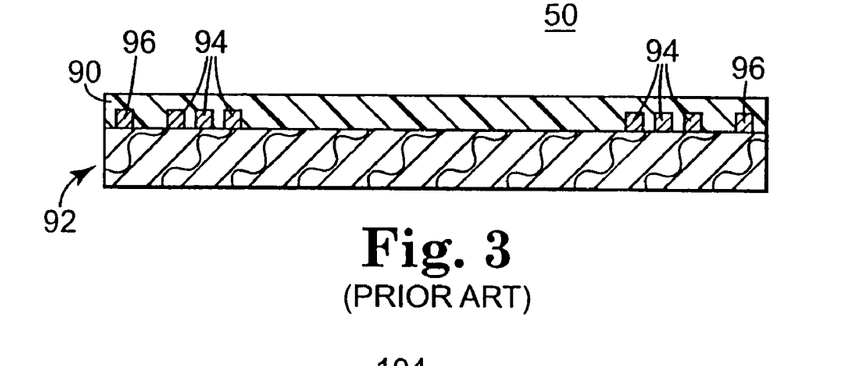
FIG. 3 is a schematic cross sectional view of a prior art waterslide decal used to apply the edge electrode pattern to the touch screen shown in FIG. 2.

In the prior art, edge electrode pattern 70 and wire traces 84, 72, 80, and 76 were sometimes screen printed on panel 60. The problems associated with this method are discussed in the background section above. In another embodiment, the edge electrode pattern and the wire traces were transferred to resistive coating 62 by a large area waterslide decal. See U.S. Pat. No. 6,280,552 incorporated herein by this reference. The problems sometimes associated with this method are also discussed in the background section and include the fact that cover coat 90, FIG. 3 of waterslide decal 92 had to be burned off the panel resulting in additional firing time and temperature adjustments and also the possibility of damaging the edge electrodes and/or the wire traces. Moreover, the decal tended to float on the glass touchscreen making automation of the transfer process difficult. Even by using the utmost care, the edge electrode pattern represented by conductive elements 94 and the wire traces represented by conductive element 96 were sometimes distorted when the waterslide decal method was used. Also, impurities in the water which contact the touch screen panel can contaminate the panel. As a result, the waterslide decal method sometimes resulted in an unpredictable, low reliability, and inaccurate procedure.

Figure 4:
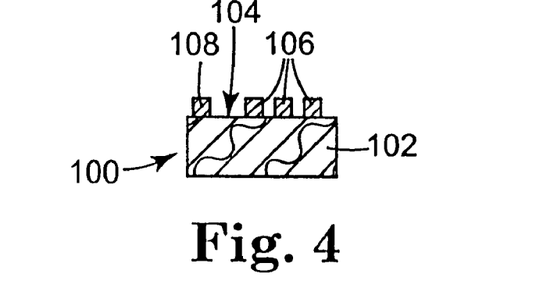
FIG. 4 is a cross sectional view of one decal used for applying an edge electrode pattern to a touch screen in accordance with the subject invention.
Figure 5:
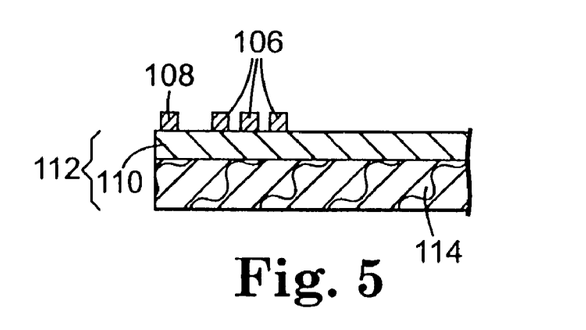
FIG. 5 is a cross sectional view of a portion of a touch screen panel when the decal shown in FIG. 4 is used to apply the edge electrode pattern to the touch screen in accordance with one method of the subject invention.

In this invention, heat transfer decal 100, FIG. 4, typically in the form of a strip as shown, is used for transferring the edge electrode pattern to a touch screen via a heat transfer method. The silver/frit paste conventionally used for the edge electrodes and the wire traces may not be easily released from a heat transfer decal. Thus, in this invention, decal strip 100 preferably includes decal paper 102 and, on top surface 104 of decal paper 102, a conductive material mixed with an additive printed in the form of an edge electrode pattern forming edge electrodes 106 and, preferably, one or more wire traces 108 forming a wire trace pattern adjacent the edge electrode pattern as shown. The method of applying the edge electrode pattern to the touch screen in accordance with this invention includes depositing on surface 104 of decal paper strip 102 conductive material in the form of an edge electrode pattern and the wire traces and then placing surface 104 of the decal on resistive layer 110, FIG. 5 of touch screen 112 which includes glass substrate 114. Heat and pressure is then applied to the opposite surface of the decal paper until the additive allows the edge electrode pattern and the associated wire trace or traces to be transferred from the decal paper to the resistive layer (e.g., a tin antimony composition) of the touch screen as shown in FIG. 5 after which the decal paper is removed.

Figure 6:
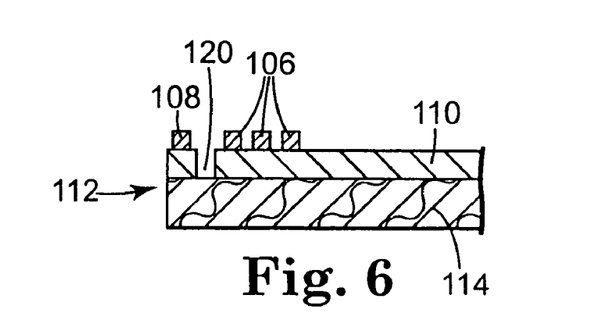
FIG. 6 is a schematic view of the portion of the touch screen panel shown in FIG. 5 after the resistive layer is removed between the wire traces and the edge electrodes in order to electrically isolate them in accordance with the subject invention.

In this embodiment, the wire traces are electrically isolated from the edge electrodes by removing the resistive material between the edge electrodes and the wire traces as shown at 120 in FIG. 6. Also, if there are two or more wire traces, as shown at top edge 210, FIG. 2, they are isolated from each other by the same technique. Typically, a laser is used to ablate the resistive material between wire traces and the edge electrodes as discussed in U.S. patent application Ser. Nos. 09/775,253 and 09/773,979. In another example, there is no resistive layer material under wire trace 108, FIG. 6. In this case, the resistive material in that region is patterned before the decal is applied.

Figure 7:
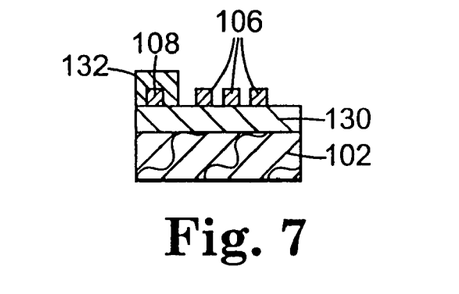
FIG. 7 is a cross sectional view of another embodiment of the decal used to apply an edge electrode pattern to a touch screen in accordance with the subject invention.
Figure 8:
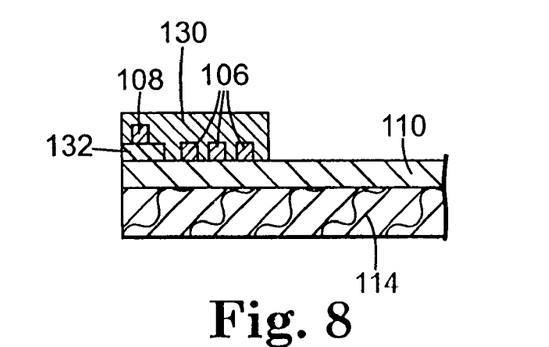
FIG. 8 is a cross sectional view of a portion of a touch screen after the decal shown in FIG. 7 is used to apply the edge electrode pattern and the wiring traces to the touch screen.

In another embodiment, the need to ablate the resistive material is eliminated by the addition of an isolation layer, namely dielectric material 132, FIG. 7 deposited over wire trace 108 on decal paper 102. Furthermore, protective layer 130 is deposited between edge electrodes 106 and wire trace 108 and decal paper 102. When turned upside-down and applied to resistive layer 110, FIG. 8 on substrate 114 of a touch screen, dielectric layer 132 electrically isolates wire trace 108 from edge electrodes 106 and protective layer 130 protects both the wire traces and the edge electrodes.

Figure 9:
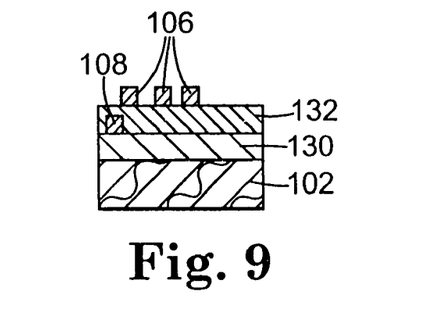
FIG. 9 is a schematic cross sectional view of still another embodiment for the decal of the subject invention.
Figure 10:
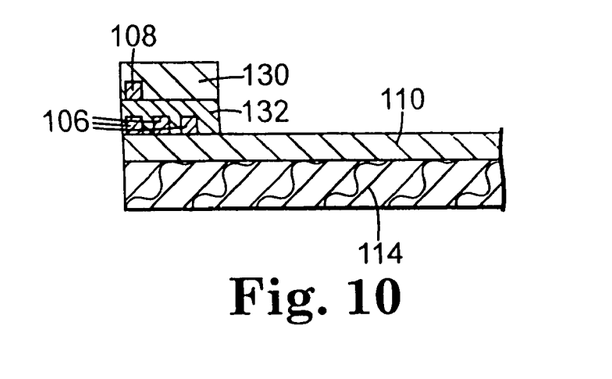
FIG. 10 is a schematic cross sectional view of a portion of a touch screen after the decal shown in FIG. 9 is used to transfer the edge electrode pattern and a wire traces to a touch screen.

In still another embodiment, protective layer 130, FIG. 9 is deposited between wire trace 108 and decal paper 102 and dielectric material 132 is deposited between wire trace 108 and edge electrodes 106. When this decal is turned upside-down, as shown in FIG. 10 and placed on resistive layer 110 of the touch screen substrate, dielectric material 132 serves to isolate wire trace 108 from edge electrodes 106 and the combination of dielectric material 132 and protective layer 130 protects the edge electrodes and the wire traces. Also, in this embodiment, since the wire traces are placed over the edge electrodes, less space is taken up on the edges of the touch screen resulting in a larger active portion.

Figure 11:
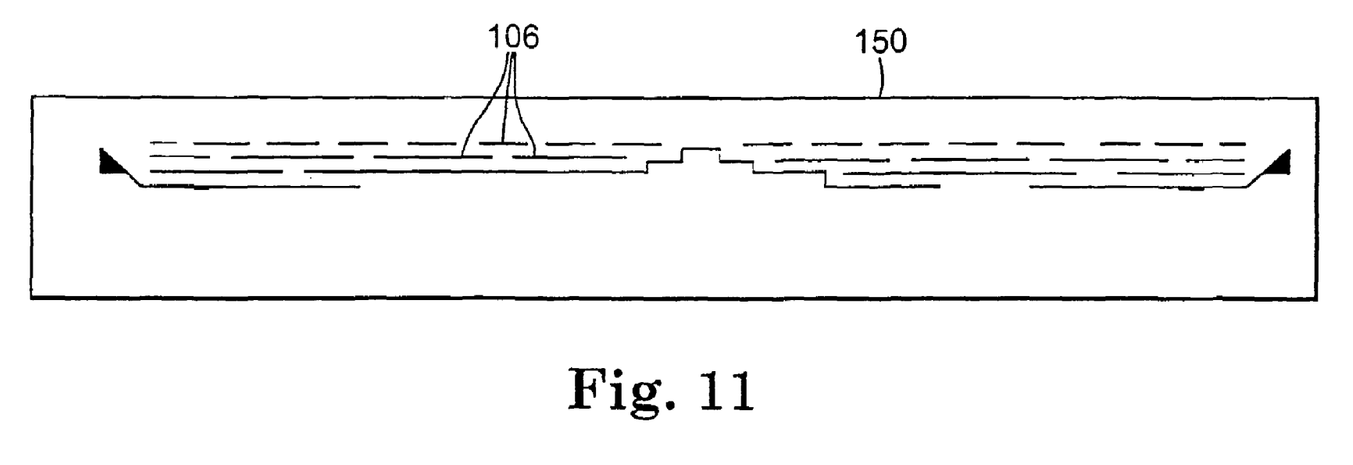
FIG. 11 is a top view of an actual decal in accordance with the subject invention.

In the preferred embodiment, the decal (Meyercord, a division of ITW, Carol Stream, Ill.), is in the form of strip 150, FIG. 11. Waterslide decals cannot be applied in strip form because the cover coat prevents the establishment of the necessary electrical contacts at the corners of panel. In this invention, decal strips can be used resulting in less product waste and hence lower costs. Decal strips are also highly suitable for automated manufacturing processes. Four 1½ inch wide strips are placed on the touch screen to transfer the edge electrode pattern and the wire traces to all four sides of the touchscreen. Heat and pressure is applied by hot stamp machine 160, FIG. 12 equipped with heated pad 162 disposed between feed roll 164 providing a supply of decal paper and take up roll 166 and over holder 168 for the touch screen. Machine 160 is available from United Silicone, Inc., Lancaster, N.Y., model US-25. Screen printing is the preferred technique for printing the modified conductive silver/frit paste onto the decal paper.

Figure 12:
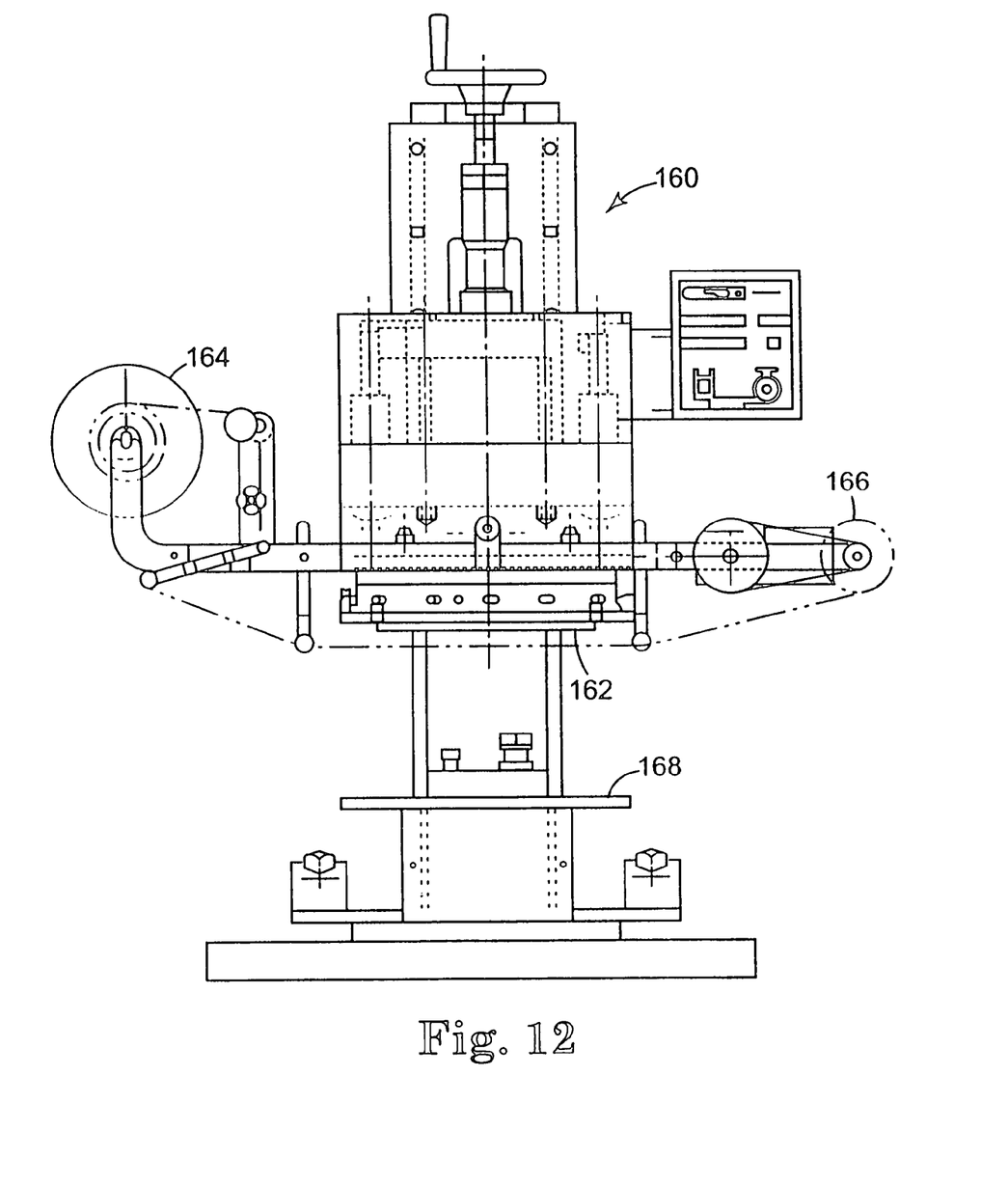
FIG. 12 is a front schematic view of the primary components associated with the hot stamp machine useful in accordance with the method of transferring an edge electrode pattern to a touch screen in accordance with the subject invention.
Figure 13:
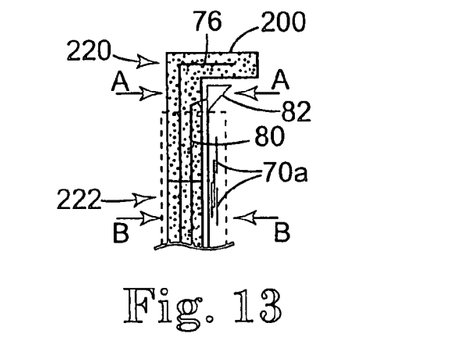
FIG. 13 is a top view of one decal used to apply the edge electrodes and the wire traces to the top edge of a touch screen panel.
Figure 14:
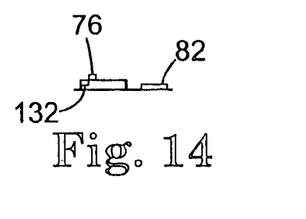
FIG. 14 is a cross sectional view of the corner electrode portion of the decal shown in FIG. 13 applied to the resistive coating of a touchscreen.
Figure 15:
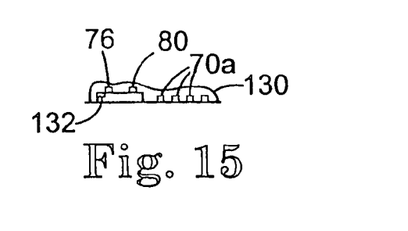
FIG. 15 is a cross sectional view of the remainder of the decal shown in FIG. 13 applied to the resistive coating of a touchscreen.

In accordance with this invention, hot stamp machine 160, FIG. 12 was used in conjunction with four decal strips to apply the edge electrode pattern and the wire traces to a touch screen as shown in FIG. 2. The first decal, decal 200, FIG. 13 was used to apply the wire traces and the edge electrode pattern to the top edge 210 of the touch screen shown in FIG. 2. Decal 200 includes wire traces 80 and 76 (and also wire traces 84 and 72, not shown) and edge electrodes 70a. In area 220, decal 200 has the cross section shown in FIG. 14 when applied to the resistive material of the panel. Dielectric material 132 is deposited underneath wire trace 76 but corner electrode 82 is deposited directly on the resistive layer. The sealing glass layer is not applied over corner pad to aid in electrical connection of the overlapping strip. Area 222 of decal 200, FIG. 13, has a cross section as shown in FIG. 15 when applied to the panel. Dielectric layer 132 is deposited under both wire traces 76 and 80 and edge electrodes 70a are deposited directly on the panel. Sealing glass or protective layer 130 in this area covers wire traces 76 and 80 and also edge electrodes 70a. As stated above, this decal is applied to top edge 210, FIG. 2 of the touch screen panel by hot stamp machine 160, FIG. 12 first.

Figure 16:
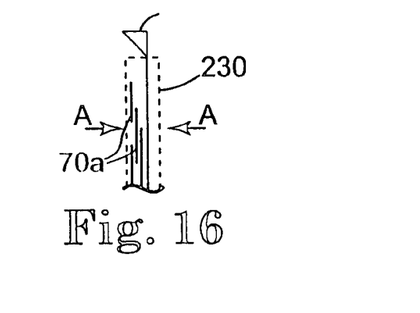
FIG. 16 is a top view of one decal used to form the edge electrode pattern on the bottom edge of a touch screen panel in accordance with the subject invention.

Next, decal 230, FIG. 16 is applied to bottom edge 232, FIG. 2 of the touch screen panel. Decal 230 includes no wire traces and only edge electrodes 70a, FIG. 17 deposited directly on the panel and covered by protective sealing glass layer 130. The corner pads are exposed for overlap of side decals. Again, hot stamp machine 160, FIG. 12 is used to apply decal 230 to the bottom edge 232, FIG. 2 of the touch screen panel.

Figures 17, 19:
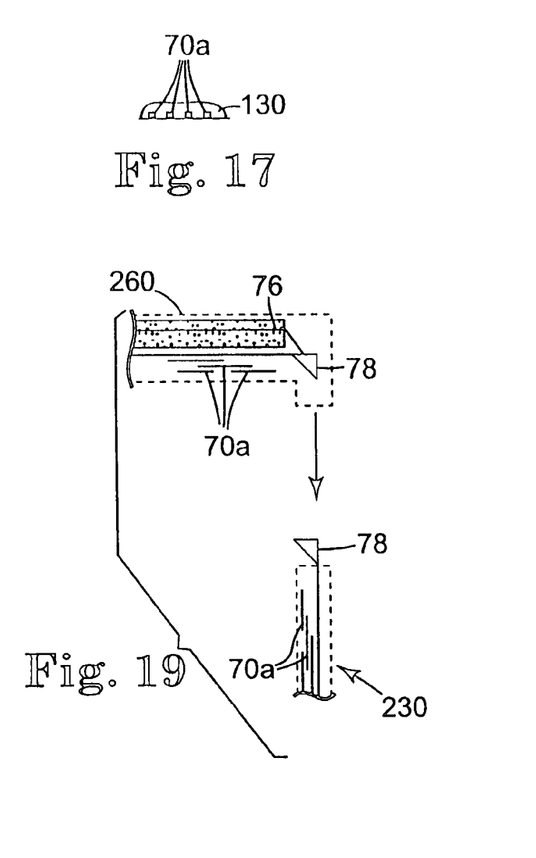
FIG. 17 is a cross sectional view of the decal shown in FIG. 16 applied to the resistive coating of a touchscreen.
FIG. 19 is a top view showing how the same side edge decal is over laid on the bottom edge decal of FIG. 16 in accordance with the subject invention.
Figure 18:
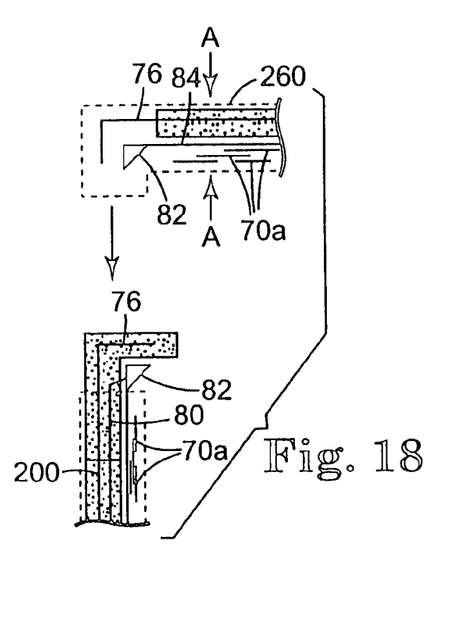
FIG. 18 is a top view showing how a side decal is overlaid on the top edge decal shown in FIG. 13 in accordance with the subject invention.

The two side edge (sides 270 and 271, FIG. 2) decals are mirror images of each other so only right hand side 271, FIG. 2 decal 260, FIG. 18 need be described. The side decals include decal paper, sealing glass, the electrodes and the wiring traces printed right on the sealing glass, and a dielectric material printed over the wire traces only. Corner electrode 82, FIG. 2 is formed by overlaying one end of decal 260, FIG. 18 with one end of decal 200 such that wire trace 76 makes the proper electrical connection and corner electrode 82 is formed. As such, the sealing glass on decal 200 ends just before corner electrode 82 while the sealing glass layer for decal 260 extends completely over corner electrode 82. At the bottom of the panel, corner electrode 78, FIG. 19 is formed in a similar fashion but there is no wire trace to be electrically interconnected. As such, the sealing glass layer in decal 260 extends completely over corner electrode 78 while the sealing glass layer of decal 230 stops just short of corner electrode 78. This overlapping process ensures continuous overlapping dielectric and glass layers and, at the same time, ensures the proper electrical interconnections are made.

Figure 20:
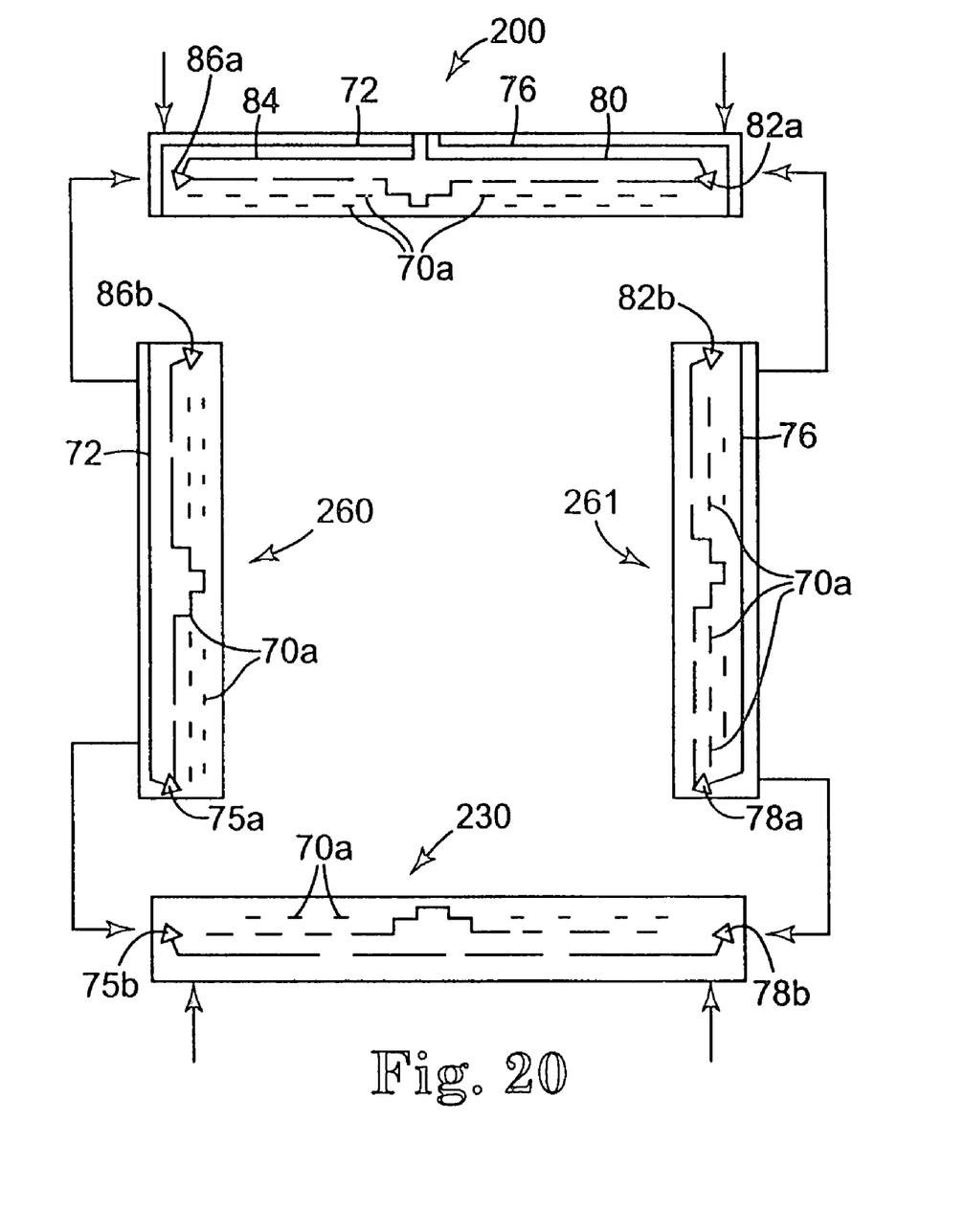
FIG. 20 is a schematic top view showing four decal strips used in one method of this invention.

In this way, top edge decal 200, bottom edge decal 230, left edge decal 260 and right edge decal 261, FIG. 20 are placed on the resistive layer of the touch screen forming edge electrodes 70, wire traces 72, 76, 80 and 84, and corner electrodes 86, 82, 75, and 78. In the preferred embodiment, corner electrode 86 is formed by including corner electrode 86a on decal 200 and one corner electrode 86b on decal 260. Similarly, corner electrode portions 82a and 82b on decals 200 and 261, corner electrode portions 78a and 78b on decals 261 and 230, and corner electrode portions 75a and 75b on decals 260 and 230 form corner electrodes 82, 78, and 75, respectively. In the preferred embodiment, a dielectric layer is screen printed on the decal paper over all the wire traces to isolate them from the edge electrodes. A sealing glass layer is screen printed under the edge electrodes and the wire traces except at the terminal ends of decals 200 and 230 where corner electrode portions 86a, 82a, 75b, and 78b and wire traces 72 and 76 are left uncovered so that they establish electrical contact with corner electrode portions 86b, 82b, 75a, and 78a and wire traces 72 and 76 of side decals 260 and 261. The preferred dielectric material is lead borosilicate glass (Dupont DG150) 10 microns thick. Screen printing is typically the method used to apply the dielectric layer. The preferred protective layer is lead borosilicate glass (Dupont DG150) 10 microns thick. This layer is also typically applied by screen-printing. The preferred resistive material is a tin-antimony oxide composition. The preferred glass for the substrate is soda lime. The temperatures used to apply the decal were between 300 and 400° F. with the preferred temperature being 350° F. The pressure used was between 15 and 30 Psi with 20 Psi preferred. The dwell time was about 4 seconds. After the edge electrodes and wire traces are applied, and fired, a hard coat and anti-scratch and antimicrobial coatings may be applied. See U.S. patent application Ser. Nos. 09/775,253 and 09/773,979 incorporated herein by this reference.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:
1. A method of applying an edge electrode pattern to a touch screen, the method comprising:
depositing, on a first surface of a decal strip, conductive material in the form of an edge electrode pattern and a wire trace pattern;
placing the first surface of the decal strip on one edge of a touch screen;

applying heat and pressure to an opposite surface of the decal strip until the edge electrode pattern is transferred from the first surface of the decal strip to the touch screen;

removing the decal strip; and isolating the wire trace pattern from the edge electrode pattern after the wire trace pattern and the edge electrode pattern are transferred to the touch screen.

2. The method of claim 1 in which isolating includes using a laser to remove material between the wire trace pattern and the edge electrode pattern.

3. The method of claim 1 in which heat and pressure is applied by a hot stamp machine equipped with a heated pad disposed between a feed roll of decal paper and take up roll and over a holder for the touch screen.

4. The method of claim 1 in which depositing includes screen printing the conductive material onto the decal strip.

5. The method of claim 1 in which the temperature used to apply heat is between 300 and 400° F. and the pressure applied is between 15 Psi and 30 Psi.

* * * * *